United States Patent
Ju

[11] Patent Number: 6,015,742
[45] Date of Patent: Jan. 18, 2000

[54] METHOD FOR FABRICATING INDUCTOR OF SEMICONDUCTOR DEVICE

[75] Inventor: Jae Il Ju, Chungcheongbuk-do, Rep. of Korea

[73] Assignee: LG Semicon Co., Ltd., Chungcheongbuk-do, Rep. of Korea

[21] Appl. No.: 09/053,500

[22] Filed: Apr. 2, 1998

[30] Foreign Application Priority Data

Sep. 29, 1997 [KR] Rep. of Korea .................. 97/49794

[51] Int. Cl.$^7$ .................................................. H01L 21/20
[52] U.S. Cl. .................... 438/381; 438/238; 438/171; 438/329
[58] Field of Search .................... 438/381, 619, 438/238, 171, 328, 329, 170, 901

[56] References Cited

U.S. PATENT DOCUMENTS

| | | | |
|---|---|---|---|
| 3,988,764 | 10/1976 | Cline et al. | 357/51 |
| 5,372,967 | 12/1994 | Sundaram et al. | 438/381 |
| 5,514,832 | 5/1996 | Dusablon, Sr. et al. | 428/901 |
| 5,767,563 | 6/1998 | Imam et al. | 257/531 |
| 5,770,509 | 6/1998 | Yu et al. | 438/381 |
| 5,825,092 | 10/1998 | Delgado et al. | 257/778 |
| 5,900,764 | 5/1999 | Imam et al. | 327/343 |
| 5,917,244 | 6/1999 | Lee et al. | 257/762 |

*Primary Examiner*—Charles Bowers
*Assistant Examiner*—Thanh Nguyen
*Attorney, Agent, or Firm*—Morgan, Lewis & Bockius LLP

[57] ABSTRACT

Method for fabricating an inductor on a semiconductor substrate including a cell region in a semiconductor device is disclosed, including the steps of forming impurity diffusion regions having a predetermined diffusion depth and spaced away from one another by a predetermined distance beneath surface of a semiconductor substrate; selectively oxidizing the semiconductor substrate in a direction crossing the impurity diffusion regions to form an inductor core layer; and forming a polysilicon layer on the entire surface including the inductor core layer and selectively patterning the polysilicon layer to form a plurality of polysilicon pattern layers each connecting with one of ends of the impurity diffusion regions with an opposite end of the adjacent impurity diffusion region so as to form an inductor coil layer electronically connecting the impurity diffusion regions.

12 Claims, 9 Drawing Sheets

METHOD FOR FABRICATING INDUCTOR OF SEMICONDUCTOR DEVICE

BACKGROUND OF THE INVENTION

1. Field of the Invention

The present invention relates to a semiconductor device and, more particularly, to a method for fabricating an inductor on a semiconductor substrate including a cell region in a semiconductor device.

2. Discussion of the Related Art

Currently, there are suggested several methods for realizing inductance in a semiconductor region. Since it is difficult to form both an inductor and a transistor on a substrate and it is impossible to realize an enough inductance, they have not applied to mass production.

A conventional method for fabricating an inductor will be described with reference to the accompanying drawings.

FIG. 1 shows a construction of a general inductor and FIGS. 2A and 2B show constructions of conventional inductors.

As shown in FIG. 1, three-dimensional is the construction of a general inductor which, as a single device, includes a core and a coil winding the core (U.S. Pat. No. 3,988,764).

FIGS. 2A and 2B show the inductor of FIG. 1 realized in a silicon body. The inductor includes a silicon body 1, a plurality of cylindrical diffusion layers 2 of opposite conductivity type penetrating the silicon body 1, a plurality of bottom connection layers 3 each connecting two opposite diffusion layers 2 and placed at the bottom of the silicon body 1, and top connection layers 4 each diagonally connecting one of the two diffusion layers 2 connected by the bottom connection layer 3 with one of two adjacent diffusion layers 2 connected by another bottom connection layer 3. Such an conventional inductor, connected electrically to the arrangement of a serial electric circuits, functions as an inductor coil.

Since the conventional method including a deep trench etch process, an epitaxial growth, a recrystallization process, and a high temperature process, is very complicated and impractical, it doesn't apply to the mass production for ULSI (Ultra Large Scaled Integrated) chips.

SUMMARY OF THE INVENTION

Therefore, the present invention is directed to a method for fabricating an inductor of a semiconductor device that substantially obviates one or more of problems due to limitations and disadvantages of the related art.

An object of the invention is to provide an inductor-fabricating method in which its process steps are performed in association with the process steps of fabricating a semiconductor device so that an inductor is fabricated in the same substrate on which the semiconductor device is fabricated.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating an inductor of a semiconductor device includes the steps of forming impurity diffusion regions having a predetermined diffusion depth and spaced away from one another by a predetermined distance beneath surface of a semiconductor substrate; selectively oxidizing the semiconductor substrate in a direction crossing the impurity diffusion regions to form an inductor core layer; and forming a polysilicon layer on the entire surface including the inductor core layer and selectively patterning the polysilicon layer to form a plurality of polysilicon pattern layers each connecting with one of ends of the impurity diffusion regions with an opposite end of the adjacent impurity diffusion region so as to form an inductor coil layer electronically connecting the impurity diffusion regions.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
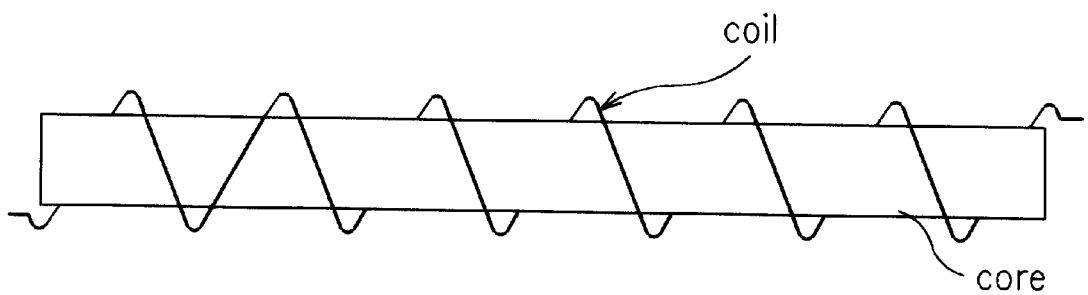
FIG. 1 shows a construction of a general inductor.
Figure 2A:
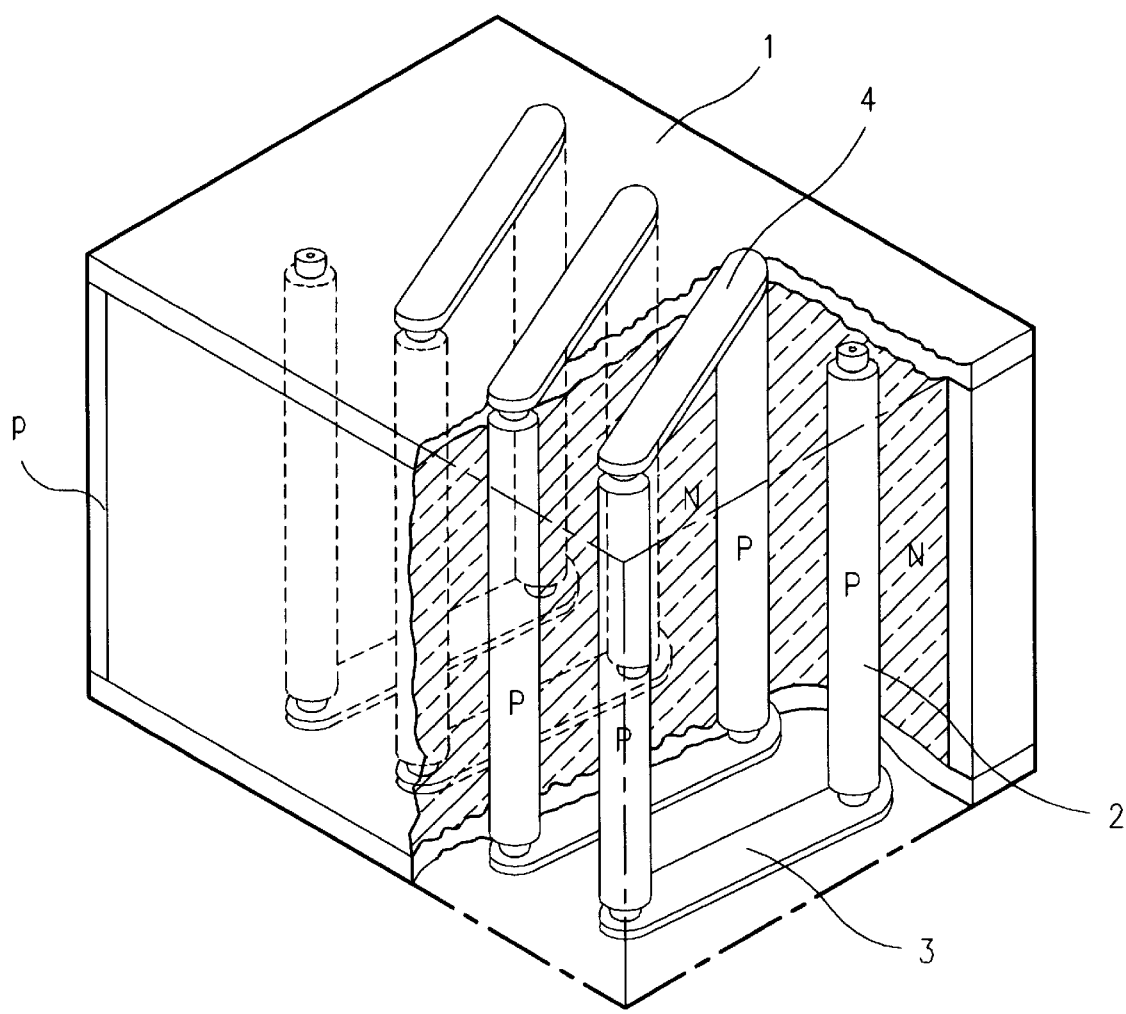
FIGS. 2A and 2B shows constructions of a conventional inductor.
Figure 2B:
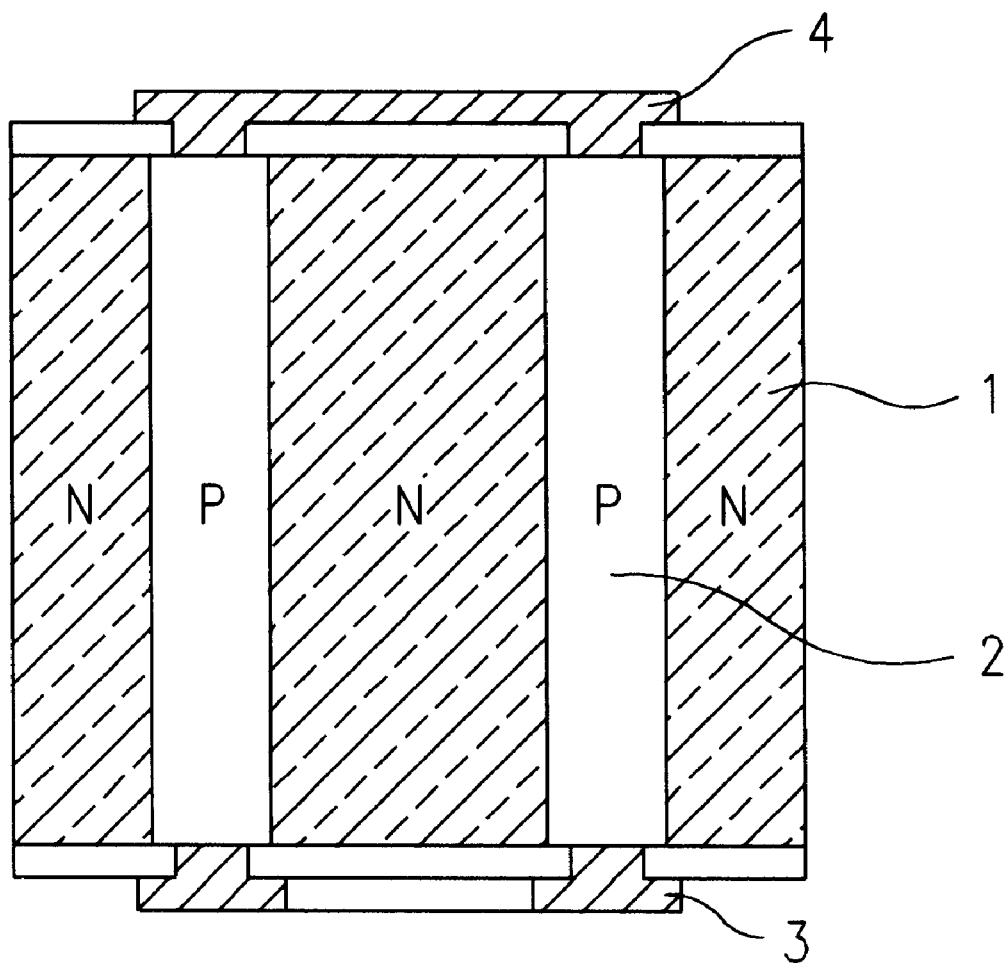
Figure 3A:
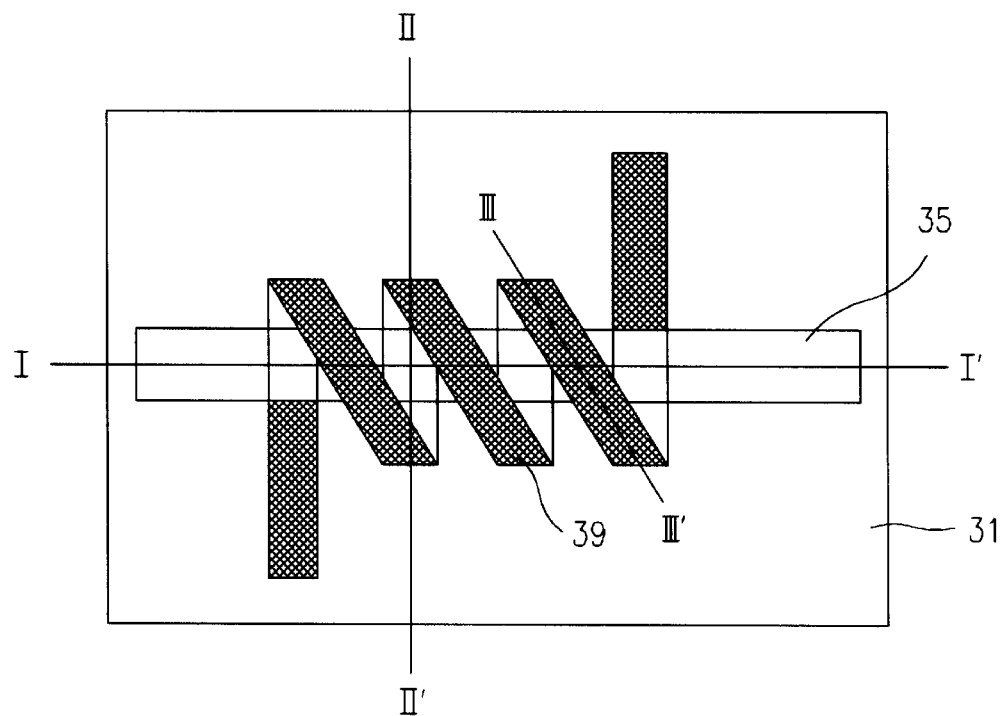
FIGS. 3A and 3B are a layout of an inductor and a cross-sectional view of its construction, respectively.
Figure 3B:
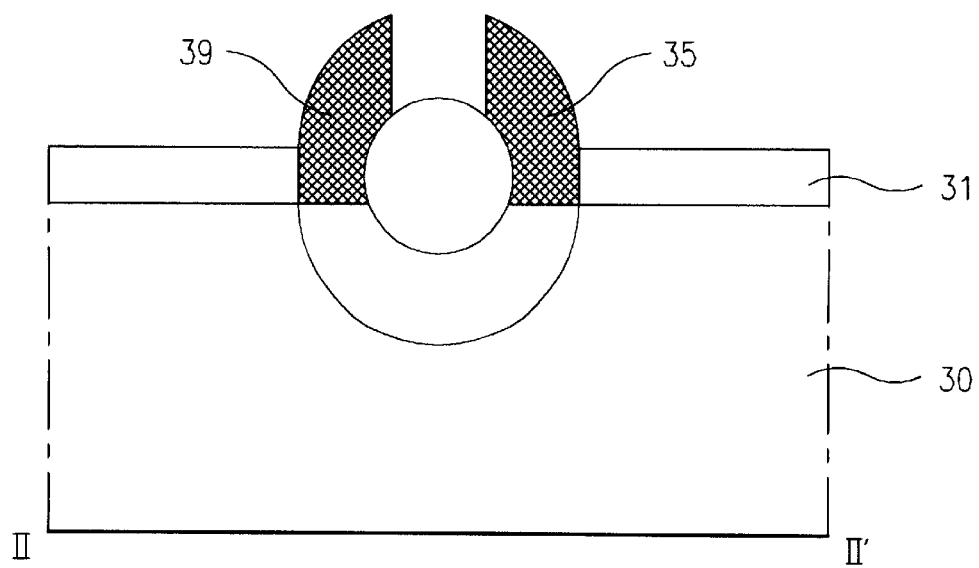
Figure 4A:
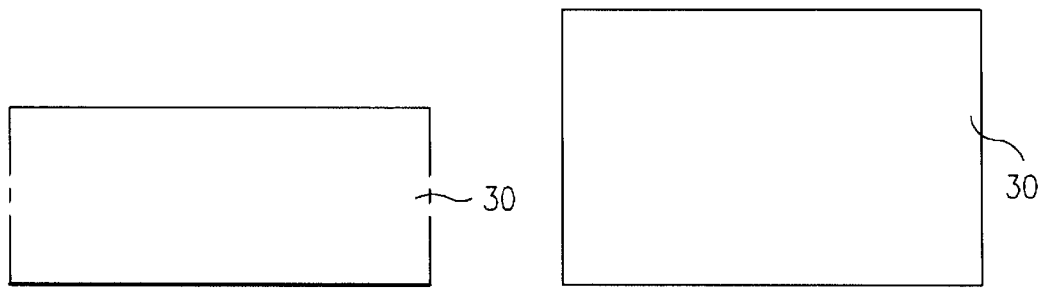
FIGS. 4A to 4P are cross-sectional views and plan views showing process steps of a method for fabricating an inductor, taken along lines I–I', II–II', and III–III', according to a preferred embodiment of the present invention.

FIGS. 3A and 3B are a layout of an inductor and a cross-sectional view showing the construction of the inductor, respectively. And FIGS. 4A to 4P are cross-sectional views and plan views of process steps of a method for fabricating an inductor according to a preferred embodiment of the present invention, taken along lines I–i', II–II', and III–III' of FIG. 3A. FIGS. 4A to 4G are cross-sectional views taken along line I–I' of FIG. 3A, FIGS. 4H to 4N are cross-sectional views taken along line II–II' of FIG. 3A, and FIGS. 4O to 4P are cross-sectional views taken along line III–III' of FIG. 3A so that stressed may be the processing characteristics in each figure taken along line at different angles. FIGS. 4A to 4P show sequential process steps.

According to the present invention, in order to realize an inductor with a high performance, a core, made of an oxide film, is formed on the same substrate where a semiconductor device is formed.

Figure 4B:
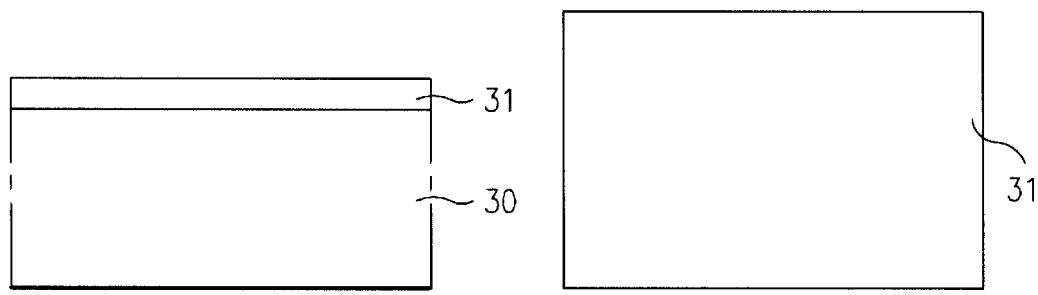

Referring to FIG. 4A, a semiconductor substrate 30 of first conductivity type is prepared and an oxide film 31 is formed thereon as shown in FIG. 4B.

Figure 4C:
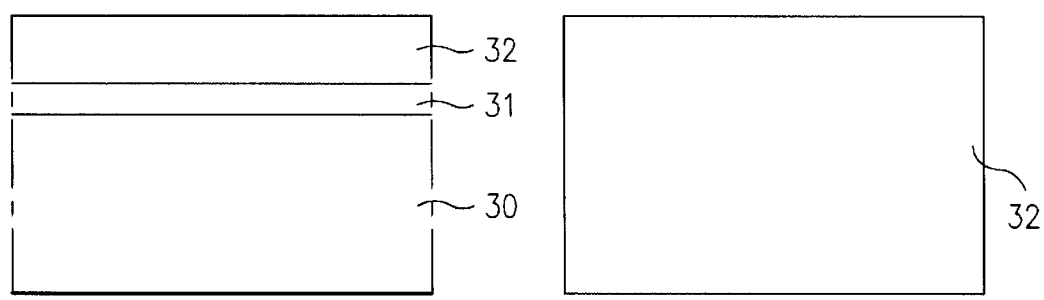
Figure 4D:
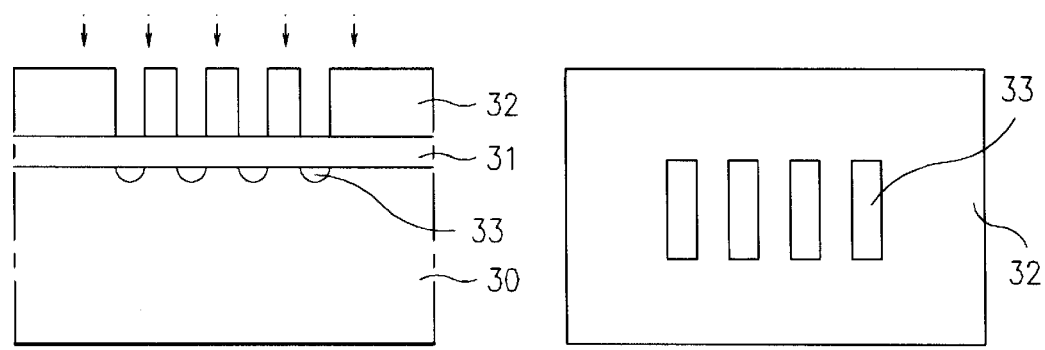

Referring to FIGS. 4C and 4D, a first photoresist film 32 is coated on the oxide film 31 and is then patterned with a photolithography process to be removed over a placement of an inductor coil layer. The region where the photoresist film is removed is formed to be divided in the length direction into a plurality of regions having the same size. The whole region in rectangular. Its length is twice as long as its width in a length direction of the whole region for an inductor.

Next, the patterned first photoresist film 32 serving as a mask, impurity ions of second conductivity type (P ions or B ions) are implanted into the semiconductor substrate 30, thereby forming impurity diffusion regions 33.

Figure 4E:
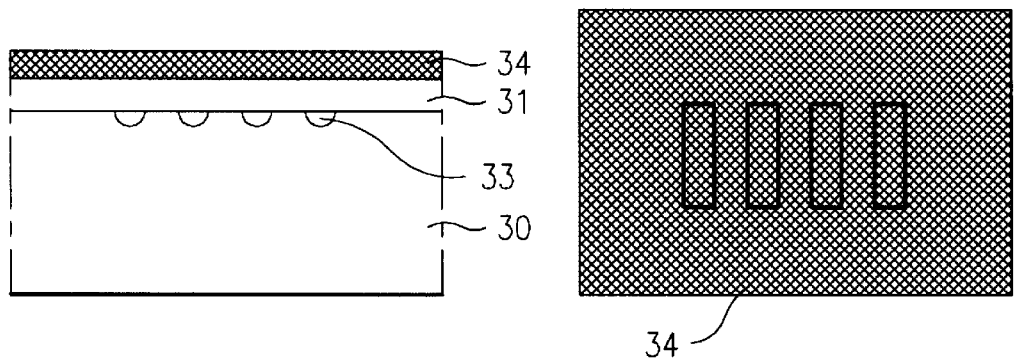

Referring to FIG. 4E, the remaining first photoresist film 32 is removed and a nitride film 34 is formed on the oxide film 31.

Figure 4F:
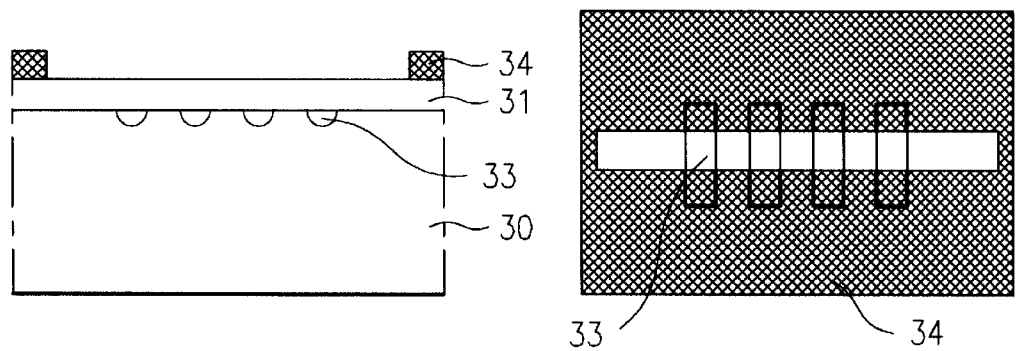

Referring to FIG. 4F, the nitride film 34 is selectively removed to open a placement of an inductor core. At this time, this nitride layer 34 is a field oxide mask layer for formation of device-isolating regions used as isolation layers of transistors. The region of the removed nitride 34 crosses the middle of the impurity diffusion regions 33.

Figure 4G:
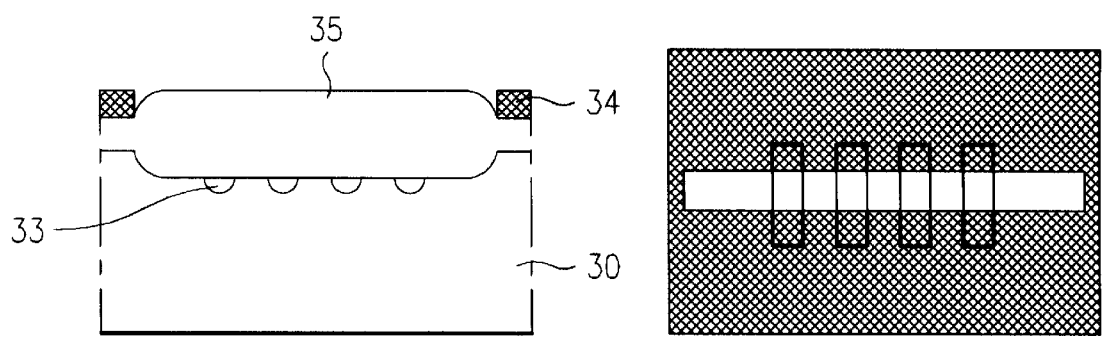
Figure 4H:
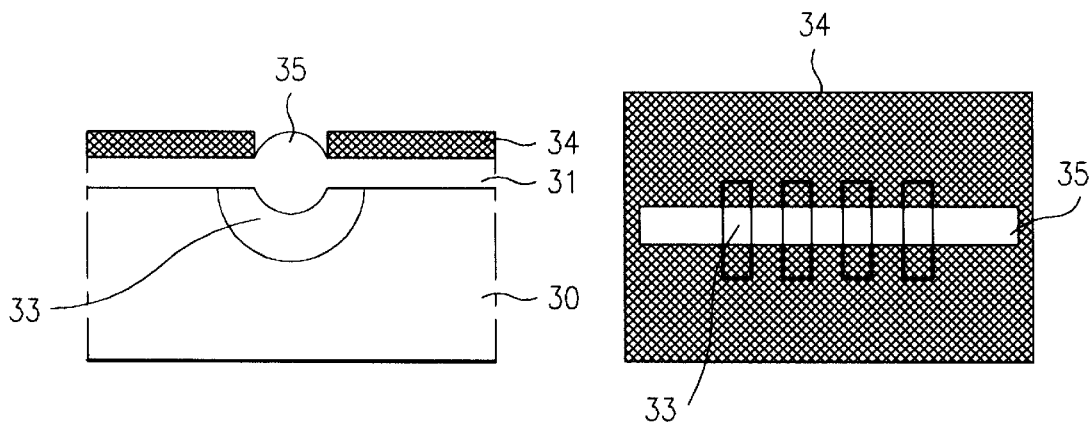

Referring to FIGS. 4G and 4H, with the patterned nitride film 34 serving as a mask, a field oxidation process is performed to form an inductor core layer 35 made of an oxide film.

Figure 4I:
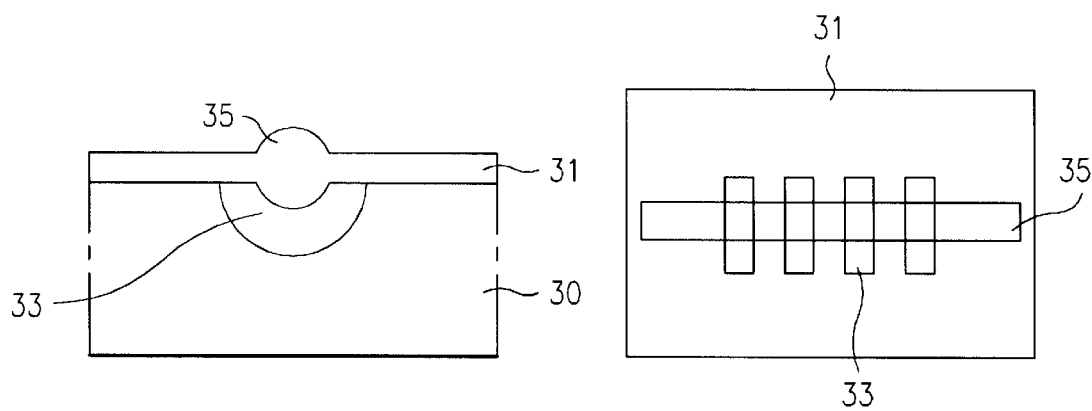
Figure 4J:
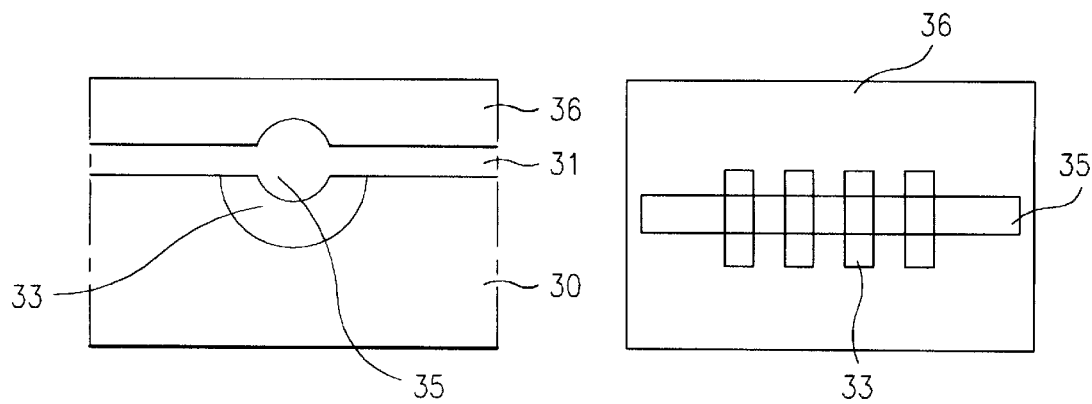

Referring to FIGS. 4I and 4J, the nitride film 34 is removed and a second photoresist film 36 is then coated.

Figure 4K:
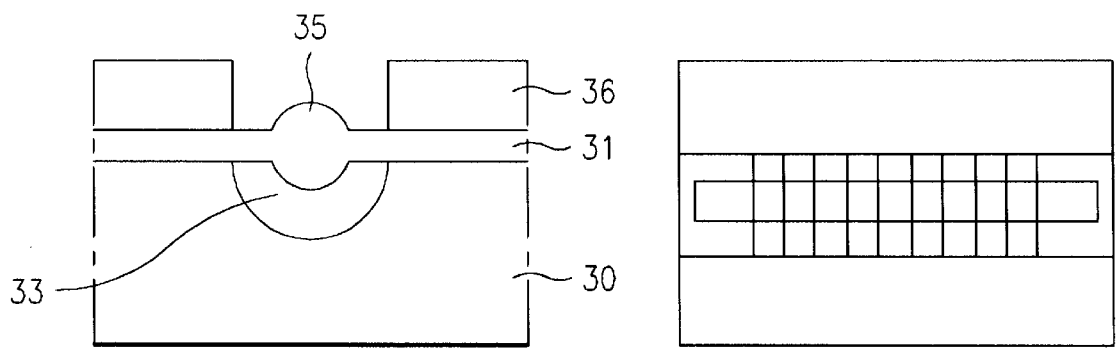

Referring to FIG. 4k, the photoresist film 36 is removed by a width of bigger than the width of the core layer 35 above the divided impurity diffusion regions 33.

Figure 4L:
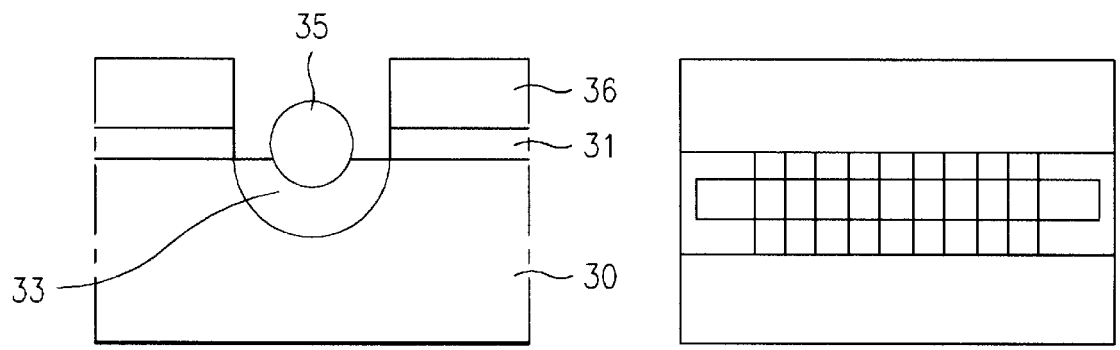

Referring to FIG. 4L, with the patterned second photoresist film 36 serving as a mask, the exposed oxide film 31 is removed so that the edge of the impurity diffusion region 33 is exposed. At this time, the inductor core layer 35 is removed by an ultimately tiny amount so that the inductor core layer 35 is not affected.

Figure 4M:
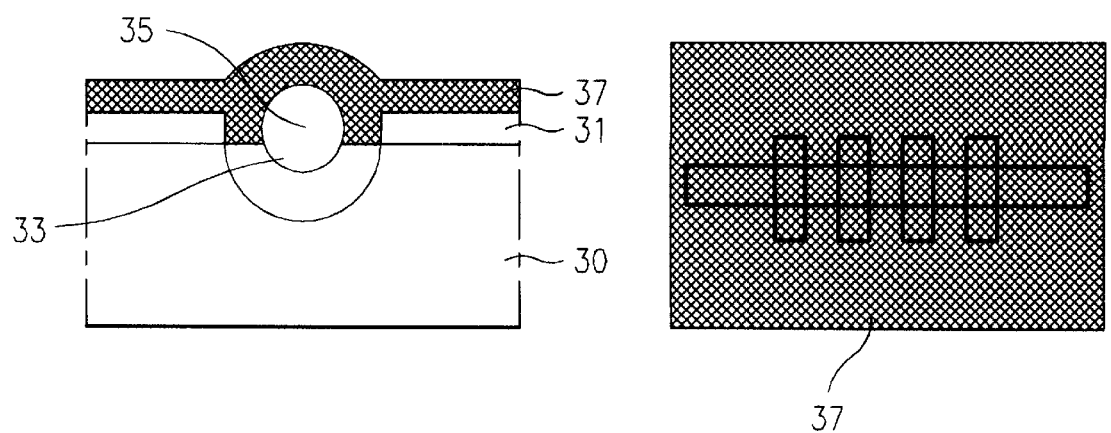
Figure 4N:
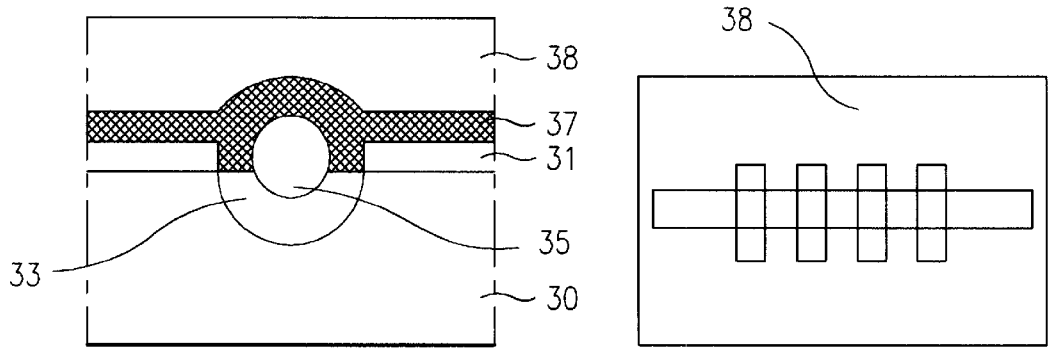
Figure 4O:
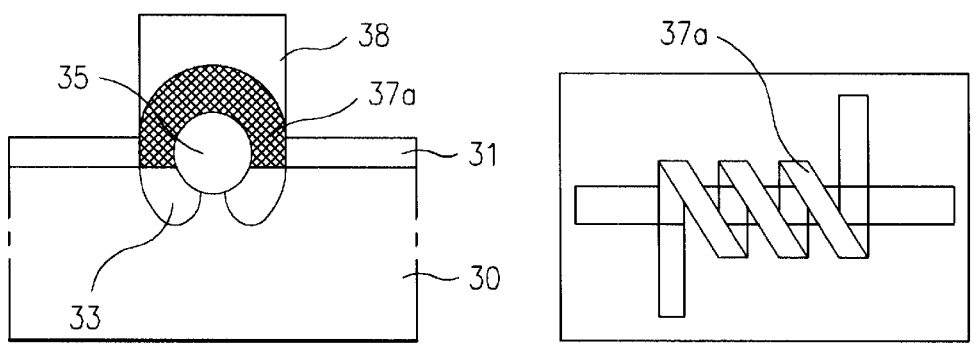
Figure 4P:
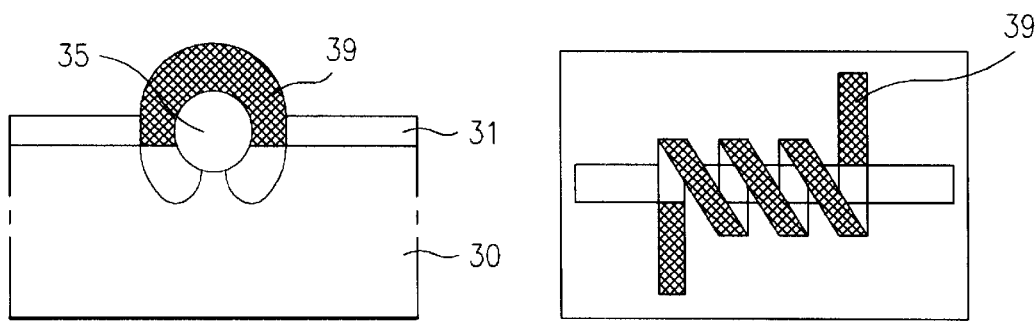

Referring to FIG. 4M, the second photoresist film 36 is removed and a heavily doped polysilicon layer 37 is deposited on the entire surface of the oxide film 31 including the inductor core layer 35. Subsequently, a third photoresist film 38 is coated on the entire surface of the polysilicon layer 37, as shown in FIG. 4N.

Referring to FIG. 4O, the third photoresist film 38 is selectively removed to form a mask. This third photoresist film 38 as wide as the width of the impurity diffusion region 33 remains over the inductor core layer 35 in a diagonal direction (45°±15°).

Referring to FIG. 4P, the exposed polysilicon layer 37 is selectively etched with the patterned third photoresist film 38 serving as a mask, thereby forming a polysilicon pattern layer 37a. The polysilicon pattern layer 37a is connected to the impurity diffusion region 33 formed under the inductor core layer 35. That is, one end of the polysilicon layer 37 formed diagonally is connected to an end of an impurity diffusion region 33 and connected to an end of another impurity diffusion region 33.

Since an inductor core layer made of an oxide is wounded by a diffusion layer and a polysilicon layer of a coil form, the modification of a field oxide mask can make an inductor formed on the same substrate where a semiconductor device is formed. Accordingly, a process for fabricating an inductor is performed in association with that for fabricating transistors in cell regions.

The method for fabricating an inductor in a semiconductor device has the following advantages. Since an inductor can be simply fabricated by adding some process steps to the proces for fabricating MOS and bipolar transistors, it can be formed on the same substrate where MOS capacitors are formed, not on outside of a chip. This method can apply to mass production and bring about the reduction of material cost and a board consisting of integrated circuits. Further, since the inductor core layer is wound by a diffusion layer and a polysilicon layer of a coil form, high performance for the inductor can be achieved.

It will be apparent to those skilled in the art that various modification and variations can be made in the method for fabricating an inductor in a semiconductor device of the present invention without departing from the spirit or scope of the inventions. Thus, it is intended that the present invention cover the modifications and variations of this invention provided they come within the scope of the appended claims and their equivalents.

What is claimed is:

1. A method for fabricating an inductor of a semiconductor device comprising the steps of:

forming impurity diffusion regions having a predetermined diffusion depth and spaced away from one another by a predetermined distance beneath surface of a semiconductor substrate;

selectively oxidizing the semiconductor substrate in a direction crossing the impurity diffusion regions to form an inductor core layer; and forming a polysilicon layer on the entire surface including the inductor core layer and selectively patterning the polysilicon layer to form a plurality of polysilicon pattern layers each connecting with one of ends of the impurity diffusion regions with an opposite end of the adjacent impurity diffusion region so as to form an inductor coil layer electronically connecting the impurity diffusion regions.

2. The method as claimed in claim 1, wherein when the semiconductor substrate is selectively oxidized to form the inductor core layer, an field oxide film is simultaneously formed in a device-isolation region of a cell region where cell transistors are formed.

3. The method as claimed in claim 1, wherein when the polysilicon layer is formed, the polysilicon layer simultaneously is formed on the cell region, and when the patterning process is performed to form the polysilicon pattern layer, gate electrodes of the cell transistors are simultaneously formed.

4. The method as claimed in claim 1, wherein the impurity diffusion regions are formed by heavily implanting impurity ions of a conductivity type opposite to that of the semiconductor substrate.

5. The method as claimed in claim 1, wherein all the impurity regions have identical rectangular size and form having a major axis and a minor axis.

6. The method as claimed in claim 1, wherein the polysilicon pattern layers have the same width as the impurity diffusion regions and are formed to be turned by 45° (±15°) with respect to the main axis of each impurity diffusion region.

7. A method for fabricating an inductor of a semiconductor device comprising the steps of:

successively forming an oxide film, a first photoresist film on a semiconductor substrate and selectively patterning the first photoresist film;

forming impurity diffusion regions beneath surface of the semiconductor substrate with the first photoresist film serving as a mask;

forming a nitride layer on the oxide film and selectively removing the nitride layer and subjecting an oxidation process to form an inductor core layer;

forming and patterning a second photoresist film on the entire surface including the inductor core layer and then selectively removing the oxide film by using the second photoresist film as a mask so as to expose end portions of each of the impurity diffusion region;

removing the second photoresist film and successively forming a heavily doped polysilicon layer and a third photoresist film on the entire surface; and selectively patterning the third photoresist film and selectively etching the exposed polysilicon layer by using the third photoresist film as a mask, so as to form a polysilicon pattern layer.

8. The method as claimed in claim 7, wherein a region where the first photoresist film is removed has rectangular forms of an identical size spaced apart from one another by a predetermined distance in a length direction of a whole region of a inductor, and the length of each rectangular form is longer than twice of its width in a parallel direction with respect to a length direction of the whole region of the inductor.

9. The method as claimed in claim 7, wherein the nitride layer is removed by a predetermined width to have a form crossing middle portion of the impurity diffusion region so as to be used as a mask for the oxidation process.

10. The method as claimed in claim 7, wherein for the step of removing the oxide film to expose the end portions of the divided impurity regions, the second photoresist film is removed by a width of wider than that of the inductor core layer so as to be used as a mask.

11. The method as claimed in claim 7, wherein the third photoresist film is patterned to have an identical width with the impurity diffusion region in a diagonal direction with respect to a direction where there are formed the impurity diffusion regions formed under the inductor core layer so as to etch the polysilicon layer.

12. The method as claimed in claim 7, wherein each polysilicon pattern layer is connected to one end of any one of the impurity diffusion regions formed under the inductor core layer and to an opposite end of the adjacent impurity diffusion region.

* * * * *